(12) United States Patent
Liu

(10) Patent No.: US 12,027,561 B2
(45) Date of Patent: Jul. 2, 2024

(54) 3D IMAGE CAPTURING SYSTEM HAVING IMAGE TRANSDUCER WITH MULTIPLE PHOTOSENSITIVE LAYERS

(71) Applicant: Hao-Che Liu, Yilan County (TW)

(72) Inventor: Hao-Che Liu, Yilan County (TW)

( * ) Notice: Subject to any disclaimer, the term of this patent is extended or adjusted under 35 U.S.C. 154(b) by 419 days.

(21) Appl. No.: 17/482,582

(22) Filed: Sep. 23, 2021

(65) Prior Publication Data

US 2022/0102418 A1    Mar. 31, 2022

Related U.S. Application Data

(60) Provisional application No. 63/085,253, filed on Sep. 30, 2020.

(51) Int. Cl.
*H01L 27/146* (2006.01)
*H04N 25/75* (2023.01)

(52) U.S. Cl.
CPC .. *H01L 27/14643* (2013.01); *H01L 27/14623* (2013.01); *H01L 27/14627* (2013.01); *H01L 27/14629* (2013.01); *H04N 25/75* (2023.01)

(58) Field of Classification Search
CPC ......... H01L 27/14643; H01L 27/14623; H01L 27/14627; H01L 27/14629; H01L 27/14625; H01L 27/14634; H04N 25/75; H04N 23/10; H04N 25/53

USPC .............................................. 250/290, 208.1
See application file for complete search history.

(56) References Cited

U.S. PATENT DOCUMENTS

| 2019/0019823 | A1* | 1/2019 | Ooki | ................. H01L 27/14647 |
| 2019/0310368 | A1* | 10/2019 | LaChapelle | ............. G01S 17/08 |
| 2019/0333953 | A1* | 10/2019 | Zhao | ................. H01L 27/14629 |
| 2021/0333150 | A1* | 10/2021 | McEldowney | ... H01L 27/14605 |

FOREIGN PATENT DOCUMENTS

JP    2005353626    * 12/2005    ........... H01L 27/146

* cited by examiner

*Primary Examiner* — Thanh Luu
*Assistant Examiner* — Mai Thi Ngoc Tran
(74) *Attorney, Agent, or Firm* — Locke Lord LLP; Tim Tingkang Xia, Esq.

(57) ABSTRACT

An image transducer and a 3D image capturing system having the image transducer are provided. The image transducer includes a microlens, first function layer, first photosensitive layer, second function layer, second photosensitive layer, first read circuit and second read circuit; thus, the image transducer includes two photosensitive layers and is vertically structured. The two photosensitive layers greatly increase sensing waveband. The 3D image capturing system uses the image transducer to enhance pixel screen fineness of a 3D screen.

13 Claims, 5 Drawing Sheets

3D IMAGE CAPTURING SYSTEM HAVING IMAGE TRANSDUCER WITH MULTIPLE PHOTOSENSITIVE LAYERS

CROSS REFERENCE

The non-provisional application claims the benefit of American Provisional Application No. 63/085,253, filed on Sep. 30, 2020, the contents thereof are incorporated by reference herein.

BACKGROUND OF THE INVENTION

1. Field of the Invention

The present disclosure relates to an image transducer and a 3D image capturing system having the image transducer and, more particularly, to an image transducer with photosensitive layers and a 3D image capturing system having the image transducer.

2. Description of the Related Art

Image transducers convert optical images into electronic signals, are widely applied to digital cameras and other electronic optical apparatuses, and fall into two categories: Charge-Coupled Device (CCD) and Complementary Metal-Oxide-Semiconductor (CMOS). CCD generates signal charges upon receipt of a light beam, converts the signal charges into voltage, and outputs image information in specified time sequence. CMOS involves using CMOS active pixel sensors, with each photoelectric sensor positioned proximate to a corresponding circuit for directly converting light energy into voltage or electric current signals. Unlike CCD, CMOS does not involve signal charges but requires an analog-to-digital converting for converting output signals of CMOS into digital signals.

However, most existing cameras can only take pictures with light beams of short wavelength ranging from 450 nm to 750 nm. In addition, in a situation where background light consists of both bright light and dim light, general photography outperforms backlighting photography in terms of pixel screens obtained with image transducers. Furthermore, background light consists of plenty of light beams with different wavebands, such as white light and ultraviolet, and thus a failure to capture the wavebands of multiple light beams simultaneously always leads to a large difference between the obtained pixel screen and the initial screen.

Therefore, the present disclosure provides an image transducer and a 3D image capturing system having the image transducer. The image transducer includes two photosensitive layers and is vertically structured to simultaneously detect light beams with different wavebands without greatly increasing chip dimensions. Furthermore, in the situations where waveband for filtration carried out in the first function layer is identical to waveband for filtration carried out in the second function layer, and where a first electrical signal reaches a predetermined saturation threshold under bright light, a first read circuit transfers the first electrical signal and thus allows it to function as an output, whereas a second read circuit transfers a second electrical signal and thus allows it to function as an output, so as to restore pixel information with an algorithm, enhance the fineness of the restored screens, and greatly augment image sensing capabilities and its sensing scope.

BRIEF SUMMARY OF THE INVENTION

It is an objective of the present disclosure to provide an image transducer which comprises vertically-stacked first photosensitive layer and second photosensitive layer to simultaneously detect light beams with different wavebands without greatly increasing chip dimensions. Furthermore, in the situations where waveband for filtration carried out in the first function layer is identical to waveband for filtration carried out in the second function layer, and where a first electrical signal reaches a predetermined saturation threshold under bright light, a first read circuit transfers the first electrical signal and thus allows it to function as an output, whereas a second read circuit transfers a second electrical signal and thus allows it to function as an output, so as to restore actual image pixel information to the maximum.

Another objective of the present disclosure is to provide a 3D image capturing system capable of carrying out control and signal processing with a first computation processing module and a signal processing module, using a light beam module to assist a structural light projection module in obtaining reflecting light beams reflecting off an object, using the image transducer of the image sensing module to detect light beams with different wavebands, restoring pixel information with an algorithm and a second computation processing module, integrating depth information and pixel information with a first computation processing module, enhancing the fineness of the restored screens, and greatly augmenting image sensing capabilities and its sensing scope.

Yet another objective of the present disclosure is to provide a 3D image capturing system capable of carrying out control and signal processing with a first computation processing module and a signal processing module, obtaining reflecting light beams reflecting off an object with an image transducer and a light beam emitted from a light beam module of an image sensing module, detecting light beams with different wavebands, restoring pixel information with an algorithm and a second computation processing module, integrating depth information and pixel information with a first computation processing module, enhancing the fineness of the restored screens, and greatly augmenting image sensing capabilities and its sensing scope.

In order to achieve the above and other objectives, an embodiment of the present disclosure provides an image transducer, comprising: a microlens; a first function layer disposed below the microlens and having a first transmittance; a first photosensitive layer disposed below the first function layer and having a first electrode contact and a second electrode contact; a second function layer disposed below the first photosensitive layer and having a second transmittance; a second photosensitive layer disposed below the second function layer and having a third electrode contact and a fourth electrode contact; a first read circuit electrically connected to the first electrode contact and the second electrode contact of the first photosensitive layer; and a second read circuit electrically connected to the third electrode contact and the fourth electrode contact of the second photosensitive layer.

The first transmittance is greater than the second transmittance.

The microlens receives and transfers an incident ray to the first function layer, such that the first function layer filters the incident ray before generating and transferring a first filtered light to the first photosensitive layer. The first photosensitive layer generates a first portion light of the first filtered light and converts the first portion light into a first electrical signal. The first filtered light is absorbed by the first photosensitive layer and thus attenuates. The first photosensitive layer generates and transfers a second portion light of the first filtered light to the second function layer.

The second function layer receives and filters the second portion light to generate and transfer a second filtered light to the second photosensitive layer. The second photosensitive layer generates a third portion light of the second filtered light and converts the third portion light into a second electrical signal.

When waveband for filtration carried out in the first function layer is different from waveband for filtration carried out in the second function layer, the first read circuit receives the first electrical signal and allows the first electrical signal to function as an output, whereas the second read circuit receives the second electrical signal and allows the second electrical signal to function as an output.

When waveband for filtration carried out in the first function layer is identical to waveband for filtration carried out in the second function layer, the first read circuit receives the first electrical signal, whereas the second read circuit receives the second electrical signal. When the first electrical signal is not greater than a predetermined saturation threshold, the first read circuit transfers the first electrical signal and allows the first electrical signal to function as an output. When the first electrical signal is greater than the predetermined saturation threshold, the first read circuit transfers the first electrical signal, whereas the second read circuit transfers the second electrical signal and allows the second electrical signal to function as an output.

In a preferred embodiment, the first photosensitive layer and the second photosensitive layer are made of amorphous silicon, polycrystalline silicon, copper gallium diselenide (CGS), copper indium gallium diselenide (CIGS) or organic semiconductor but is not restricted to the aforesaid inorganic semiconductor or organic semiconductor.

In a preferred embodiment, the image transducer further comprises a first shield layer and a second shield layer. The first shield layer is disposed between the first photosensitive layer and the second function layer to shield the first photosensitive layer and the second function layer against electrical signal interference from each other. The second shield layer is disposed between the second function layer and the second photosensitive layer to shield the second function layer and the second photosensitive layer against electrical signal interference from each other.

In a preferred embodiment, the first function layer and the second function layer are each a single-waveband band-pass filtering layer, a dual-waveband band-pass filtering layer or a light polarizing layer. The single-waveband band-pass filtering layer comprises a red waveband, a blue waveband, a green waveband, a near-infrared waveband or a ultraviolet waveband. The dual-waveband band-pass filtering layer comprises a combination of the red waveband and the near-infrared waveband, a combination of the blue waveband and the near-infrared waveband or a combination of the green waveband and the near-infrared waveband. The red waveband ranges from 620 nm to 750 nm, the blue waveband from 450 nm to 495 nm, the green waveband from 495 nm to 570 nm, the near-infrared waveband from 800 nm to 2500 nm, and the ultraviolet waveband from 380 nm to 450 nm.

In a preferred embodiment, the first photosensitive layer is a photodiode, whereas the second photosensitive layer is a photodiode, avalanche photodiode (APD) or single photon avalanche diode (SPAD).

In a preferred embodiment, when the first function layer and the second function layer are a dual-waveband band-pass filtering layer and a single-waveband band-pass filtering layer, respectively, and waveband for filtration carried out in the first function layer is different from waveband for filtration carried out in the second function layer, the waveband associated with the filtration carried out in the first function layer comprises a first waveband measured by the first photosensitive layer and a second waveband measured by the second photosensitive layer, whereas the waveband associated with the filtration carried out in the second function layer is the second waveband measured by the second photosensitive layer.

In order to achieve the above and other objectives, another embodiment of the present disclosure provides a 3D image capturing system, comprising: a first computation processing module for outputting a processing command; a signal processing module in signal connection with the computation processing module to carry out signal processing according to the processing command and thereby generate a control command; a light beam module in signal connection with the signal processing module to receive and transfer a light beam to an object according to the control command, causing a first reflecting light to reflect off the object; a structural light projection module in signal connection with the signal processing module to receive and transfer an optical pattern to the object according to the control command, causing a second reflecting light to reflect off the object; and an image sensing module in signal connection with the signal processing module, the image sensing module comprising the image transducer of claim 1 and a second computation processing module. An external light beam falls on the object and thus causes a third reflecting light to reflect off the object. The microlens of the image transducer receives the first reflecting light, the second reflecting light and the third reflecting light. The third reflecting light is filtered by the first function layer and then converted by the first photosensitive layer into a first electrical signal to be outputted to the first read circuit. The first reflecting light and the second reflecting light are filtered by the second function layer and then converted by the second photosensitive layer into a second electrical signal to be outputted to the second read circuit.

When waveband of the third reflecting light filtered by the first function layer is different from waveband of the first and second reflecting lights filtered by the second function layer, the first electrical signal is received by the first read circuit to function as an output, and the second electrical signal is received by the second read circuit to function as an output. The second computation processing module receives the first and second electrical signals and performs computation in accordance therewith to obtain a pixel information and a depth information of the object.

The first and second read circuits receive the first and second electrical signals, respectively, when waveband of the third reflecting light filtered by the first function layer is identical to waveband of the first and second reflecting lights filtered by the second function layer. When the first electrical signal is not greater than a predetermined saturation threshold, the first read circuit transfers the first electrical signal, allowing the first electrical signal to function as an output. When the first electrical signal is greater than the predetermined saturation threshold, the first and second read circuits transfer the first and second electrical signals, respectively, allowing the first and second electrical signals to function as outputs. The second computation processing module receives the first and/or second electrical signals and performs computation in accordance therewith to obtain the pixel information and the depth information of the object.

The first computation processing module generates a 3D image information according to the depth information and the pixel information.

In a preferred embodiment, the light beam module further comprises a visible light beam, a near-infrared light beam and a laser light beam In a preferred embodiment, the signal processing module further comprises a digital signal processing device.

In a preferred embodiment, the second computation processing module receives the first and second electrical signals and performs computation in accordance with the first electrical signal, the second electrical signal, a first peak transmittance, a second peak transmittance, a third peak transmittance, a first light attenuation rate and a second light attenuation rate according to Beer-Lambert law to obtain a first light intensity and obtain the pixel information according to the first light intensity, or the second computation processing module receives the first electrical signal and performs computation in accordance with the first electrical signal, the first peak transmittance and the first light attenuation rate according to Beer-Lambert law to obtain a second light intensity and obtain the pixel information according to the second light intensity.

In order to achieve the above and other objectives, yet another embodiment of the present disclosure provides a 3D image capturing system, comprising: a first computation processing module for outputting a processing command; a signal processing module in signal connection with the computation processing module to carry out signal processing according to the processing command and thereby generate a control command; and an image sensing module in signal connection with the signal processing module, the image sensing module comprising the image transducer of claim 1, a light beam module and a second computation processing module, the light beam module irradiating a light beam onto an object so as for a first reflecting light to reflect off the object. An external light beam falls on the object and thus causes a second reflecting light to reflect off the object. The microlens of the image transducer receives the first reflecting light and the second reflecting light. The second reflecting light is filtered by the first function layer and then converted by the first photosensitive layer into a first electrical signal, allowing the first electrical signal to be outputted to the first read circuit. The first reflecting light is filtered by the second function layer and then converted by the second photosensitive layer into a second electrical signal, allowing the second electrical signal to be outputted to the second read circuit. The second computation processing module performs computation in accordance with the first electrical signal and the second electrical signal to obtain a pixel information and a depth information of the object.

In a preferred embodiment, the light beam module further comprises a visible light beam, a near-infrared light beam and a laser light beam.

In a preferred embodiment, the signal processing module further comprises a time digital conversion device and a digital signal processing device.

In a preferred embodiment, when the second computation processing module receives the first and second electrical signals and performs computation in accordance therewith, the second computation processing module performs computation according to Beer-Lambert law with the first electrical signal, the second electrical signal, a first peak transmittance, a second peak transmittance, a third peak transmittance, a first light attenuation rate and a second light attenuation rate to obtain a first light intensity, such that the second computation processing module obtains the pixel information according to the first light intensity.

DETAILED DESCRIPTION OF THE INVENTION

The technical features and the claims of the present disclosure are hereunder illustrated with preferred embodiments, depicted with drawings, and described below.

Figure 1:
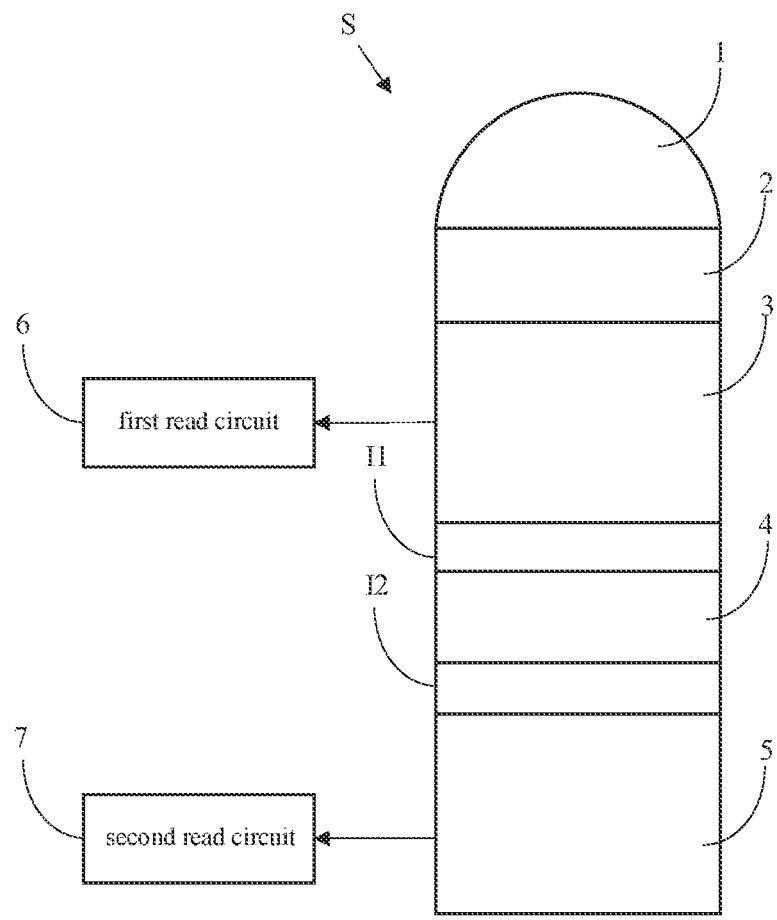
FIG. 1 is a schematic view of the system according to an embodiment of the present disclosure.

Referring to FIG. 1, there is shown a schematic view of the system according to an embodiment of the present disclosure. As shown in the diagram, an image transducer S of the present disclosure comprises a microlens 1, first function layer 2, first photosensitive layer 3, second function layer 4, second photosensitive layer 5, first read circuit 6 and second read circuit 7, stacked in the top to down order. The first function layer 2 is disposed below the microlens 1. The first photosensitive layer 3 is disposed below the first function layer 2. The second function layer 4 is disposed below the first photosensitive layer 3. The second photosensitive layer 5 is disposed below the second function layer 4. The first read circuit 6 is electrically connected to the first photosensitive layer 3. The second read circuit 7 is electrically connected to the second photosensitive layer 5. The image transducer S further comprises a first shield layer I1 and a second shield layer I2. The first shield layer I1 is disposed between the first photosensitive layer 3 and second function layer 4, whereas the second shield layer I2 is disposed between the second function layer 4 and second photosensitive layer 5, as described below.

In an embodiment, the first function layer 2 has a first transmittance. The first transmittance depends on the material which the first function layer 2 is made of. For example, when the first function layer 2 is a hard film-plated filter, its transmittance is greater than 90%, but the present disclosure is not limited thereto. The first function layer 2 is a single-waveband band-pass filtering layer, dual-waveband band-pass filtering layer or light polarizing layer. The single-waveband band-pass filtering layer is associated with red waveband, blue waveband, green waveband, near-infrared waveband or ultraviolet waveband. Each aforesaid waveband allows filtration to take place. The dual-waveband band-pass filtering layer is a combination of red waveband and near-infrared waveband, a combination of blue waveband and near-infrared waveband, or a combination of green waveband and near-infrared waveband. In this embodiment, red waveband ranges from 620 nm to 750 nm, blue waveband from 450 nm to 495 nm, green waveband from 495 nm to 570 nm, near-infrared waveband from 800 nm to 2500 nm, and ultraviolet waveband from 380 nm to 450 nm, but the present disclosure is not limited thereto.

In an embodiment, the first photosensitive layer 3 is made of amorphous silicon, polycrystalline silicon, copper gallium diselenide (CGS), copper indium gallium diselenide (CIGS), but is not restricted to the aforesaid inorganic semiconductor or organic semiconductor. The first photosensitive layer 3 is a photodiode, avalanche photodiode (APD) or single photon avalanche diode (SPAD), but the present disclosure is not limited thereto. The first photosensitive layer 3 has a first electrode contact and a second electrode contact (not shown). In an embodiment, the first photosensitive layer 3 is a P-N junction or N-P junction.

In an embodiment, the second function layer 4 has a second transmittance. The second transmittance depends on the material which the second function layer 4 is made of. For example, when the second function layer 4 is a conventional filter, its transmittance is around 75%, but the present disclosure is not limited thereto. Therefore, the second function layer 4 has lower transmittance than the first function layer 2 to ensure that the transferred light can be completely absorbed by the second photosensitive layer 5. The second function layer 4 is a single-waveband band-pass filtering layer, dual-waveband band-pass filtering layer or light polarizing layer. The single-waveband band-pass filtering layer is associated with red waveband, blue waveband, green waveband, near-infrared waveband or ultraviolet waveband. Each aforesaid waveband allows filtration to take place. The dual-waveband band-pass filtering layer is a combination of red waveband and near-infrared waveband, a combination of blue waveband and near-infrared waveband, or a combination of green waveband and near-infrared waveband. In this embodiment, red waveband ranges from 620 nm to 750 nm, blue waveband from 450 nm to 495 nm, green waveband from 495 nm to 570 nm, near-infrared waveband from 800 nm to 2500 nm, and ultraviolet waveband from 380 nm to 450 nm, but the present disclosure is not limited thereto.

In an embodiment, the second photosensitive layer 5 is made of amorphous silicon, polycrystalline silicon, copper gallium diselenide (CGS), and copper indium gallium diselenide (CIGS), but is not restricted to the aforesaid inorganic semiconductor or organic semiconductor. Furthermore, the second photosensitive layer 5 is a photodiode, avalanche photodiode (APD) or single photon avalanche diode (SPAD), but the present disclosure is not limited thereto. Therefore, the second photosensitive layer 5 has a third electrode contact and a fourth electrode contact (not shown). In an embodiment, the second photosensitive layer 5 is a P-N junction or N-P junction.

The first shield layer I1 shields the first photosensitive layer 3 and second function layer 4 from electrical signal interference. The second shield layer I2 shields the second function layer 4 and second photosensitive layer 5 from electrical signal interference. The first shield layer I1 and second shield layer I2 are high-transmittance insulating layers, but the present disclosure is not limited thereto; hence, the first photosensitive layer 3 and second photosensitive layer 5 are protected against electrical signal interference from each other, allowing the first photosensitive layer 3 and second photosensitive layer 5 to operate independently of each other and immune from interference.

The first read circuit 6 is electrically connected to the first electrode contact and second electrode contact of the first photosensitive layer 3 to receive the first electrical signal converted by the first photosensitive layer 3. The second read circuit 7 is electrically connected to the third electrode contact and fourth electrode contact of the second photosensitive layer 5 to receive the second electrical signal converted by the second photosensitive layer 5.

Figure 2:
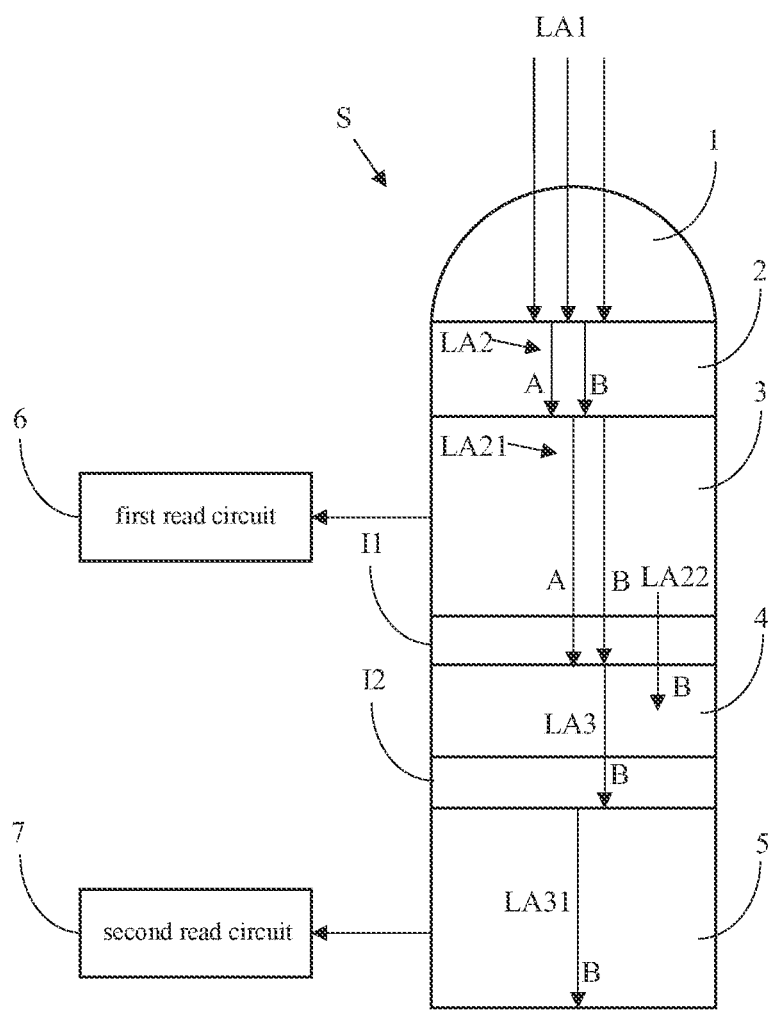
FIG. 2 is a schematic view of a light path according to the first embodiment of the present disclosure.

Referring to FIG. 2, there is shown a schematic view of a light path according to the first embodiment of the present disclosure. As shown in the diagram, in the first embodiment, the first filtered light LA2 comprises first waveband A and second waveband B, whereas the second filtered light LA3 comprises second waveband B. Thus, the microlens 1 receives and transfers incident ray LA1 to the first function layer 2, and then the first function layer 2 filters incident ray LA1, so as to generate and transfer first filtered light LA2 to the first photosensitive layer 3. The first photosensitive layer 3 generates first portion light LA21 of first filtered light LA2 and converts first portion light LA21 into a first electrical signal. The first read circuit 6 receives the first electrical signal. The first filtered light LA2 is absorbed by the first photosensitive layer 3 and thus attenuates, such that second portion light LA22 of first filtered light LA2 is generated and transferred to the second function layer 4. The second function layer 4 filters second portion light LA22 to generate and transfer second filtered light LA3 to the second photosensitive layer 5. The second photosensitive layer 5 generates third portion light LA31 of second filtered light LA3 and converts third portion light LA31 into a second electrical signal. The second read circuit 7 receives the second electrical signal.

Since first waveband A for filtration carried out in the first function layer 3 is different from second waveband B for filtration carried out in the second function layer, the signal of first waveband A in the first electrical signal received is used by the first read circuit 6 as an output. Since second waveband B for filtration carried out in the first function layer 3 is identical to second waveband B for filtration carried out in the second function layer, the first read circuit 6 receives the signal of second waveband B in the first electrical signal, and the second read circuit receives the signal of second waveband B in the second electrical signal, thereby allowing the first read circuit 6 to determine whether the signal of second waveband B in the first electrical signal is greater than a predetermined saturation threshold. When the signal of second waveband B in the first electrical signal is not greater than a predetermined saturation threshold, the first read circuit 6 only transfers the signal of second waveband B in the first electrical signal. Conversely, when the signal of second waveband B in the first electrical signal is greater than a predetermined saturation threshold, the first read circuit 6 transfers the signal of second waveband B in the first electrical signal and thus allows the signal to function as an output, and the signal of second waveband B in the first electrical signal is equal to the predetermined saturation threshold, allowing the second read circuit 7 to transfer the second electrical signal, with the second electrical signal functioning as an output.

Therefore, in this embodiment, when the signal of second waveband B in the first electrical signal is not greater than a predetermined saturation threshold, the first read circuit 6 transfers the first electrical signal, allowing the first electrical signal to function as an output. The first electrical signal comprises signals of first waveband A and second waveband B. Conversely, when second waveband B in the first electrical signal is greater than a predetermined saturation threshold, the first read circuit 6 transfers the first electrical signal and thus allows the first electrical signal to function as an output, whereas the second read circuit 7 transfers the second electrical signal and thus allows the second electrical signal to function as an output. The first electrical signal comprises signals of first waveband A and second waveband B. When the signal of second waveband B in the first electrical signal is equal to the predetermined saturation threshold, the second electrical signal comprises the signal of second waveband.

In this embodiment, when the waveband associated with the filtration carried out in the first function layer 2 comprises first waveband A and second waveband B, the first waveband corresponds to the waveband measured by the first photosensitive layer 3, whereas the second waveband corresponds to the waveband measured by the second photosensitive layer 5. Since the waveband associated with the filtration carried out in the second function layer 4 is the same as the waveband measured by the second photosensitive layer 5, the waveband measured by the first photosensitive layer 3 is first waveband A and second waveband B, whereas the waveband measured by the second photosensitive layer 5 is second waveband B.

Figure 3:
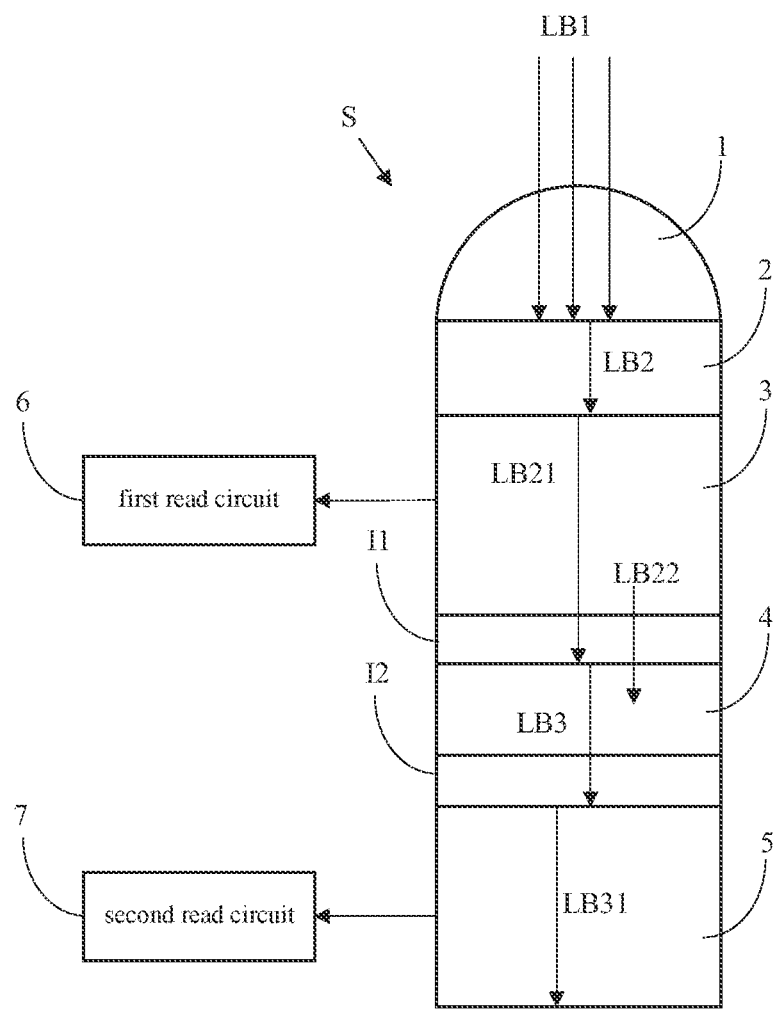
FIG. 3 is a schematic view of the light path according to the second embodiment of the present disclosure.

Referring to FIG. 3, there is shown a schematic view of the light path according to the second embodiment of the present disclosure. As shown in the diagram, in the second embodiment, when the waveband of first filtered light LB2 is the same as waveband A of second filtered light LB3, the microlens 1 receives and transfers incident ray LB1 to the first function layer 2, such that incident ray LB1 is filtered by the first function layer 2 to generate first filtered light LB2 to be transferred to the first photosensitive layer 3. The first photosensitive layer 3 uses first filtered light LB2 to generate first portion light LB21 of first filtered light LB2 and convert first portion light LB21 into the first electrical signal. The first read circuit 6 receives the first electrical signal. The first filtered light LB2 is absorbed by the first photosensitive layer 3 and thus attenuates, such that second portion light LB22 of first filtered light LB2 is generated and transferred to the second function layer 4. The second function layer 4 filters second portion light LB22 to generate and transfer second filtered light LB3 to the second photosensitive layer 5. Then, the second photosensitive layer 5 uses second filtered light LB3 to generate third portion light LB31 of second filtered light LB3 and convert third portion light LB31 into a second electrical signal. The second read circuit 7 receives the second electrical signal.

Since the waveband associated with the filtration carried out in the first function layer 3 is the same as the waveband measured by the second function layer, the first read circuit 6 receives the first electrical signal, whereas the second read circuit receives the second electrical signal, allowing the first read circuit 6 to determine whether the first electrical signal is greater than a predetermined saturation threshold. When the first electrical signal is not greater than a predetermined saturation threshold, the first read circuit 6 only transfers the first electrical signal, allowing the first electrical signal to function as an output. Conversely, when the first electrical signal is greater than a predetermined saturation threshold, the first read circuit 6 transfers the first electrical signal and thus allows it to function as an output, with the first electrical signal being equal to the predetermined saturation threshold, whereas the second read circuit 7 transfers the second electrical signal and thus allows it to function as an output.

Figure 4:
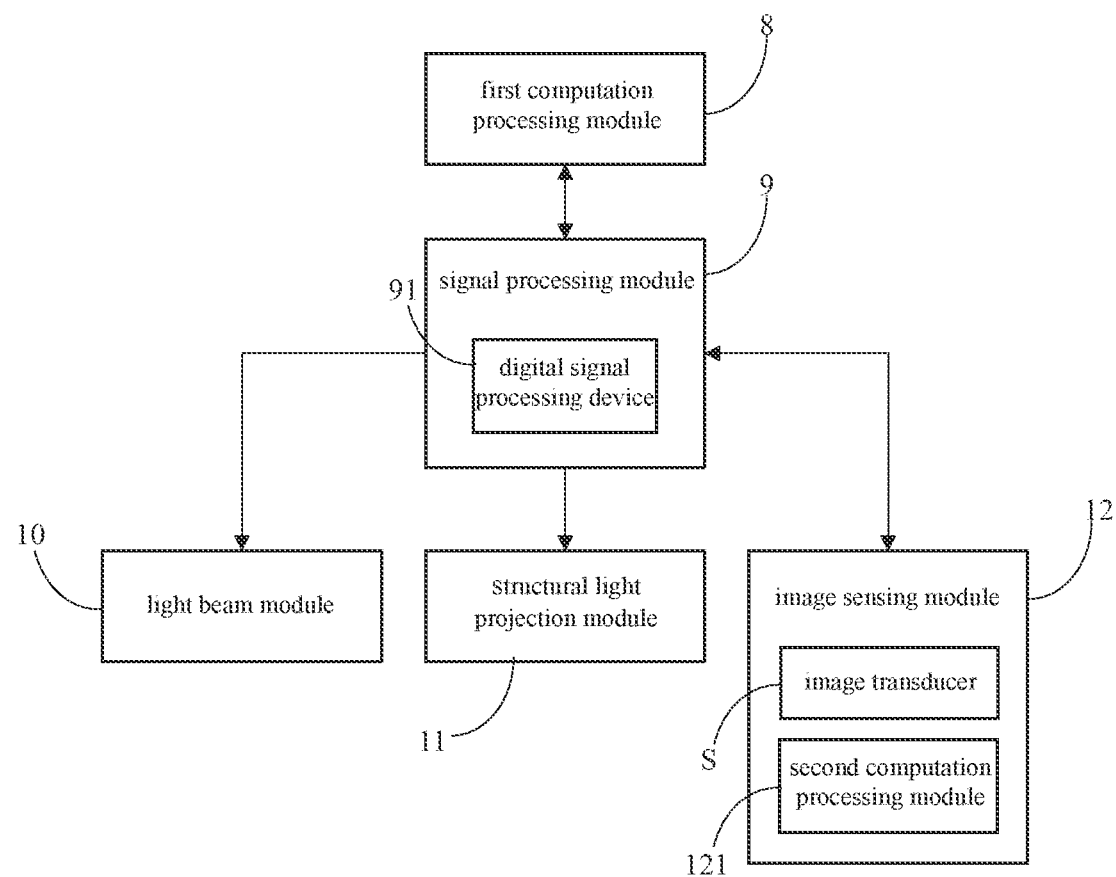
FIG. 4 is a schematic view of the system according to the third embodiment of the present disclosure.

Referring to FIG. 4, there is shown a schematic view of the system according to the third embodiment of the present disclosure. As shown in the diagram, a 3D image capturing system of the present disclosure comprises a first computation processing module 8, signal processing module 9, light beam module 10, structural light projection module 11 and image sensing module 12. The first computation processing module 8 is in signal connection with the signal processing module 9. The signal processing module 9 is in signal connection with the light beam module 10, structural light projection module 11 and image sensing module 12, as described below.

The first computation processing module 8 outputs a processing command for driving the signal processing module 9 to capture 3D images and integrate the acquired depth information and pixel information and thereby generate a 3D image information. The signal processing module 9 comprises a digital signal processing device 91 which carries out signal processing according to the processing command to thereby generate a control command for controlling the operation of the light beam module 10 and structural light projection module 11.

The light beam module 10 emits a visible light beam, near-infrared light beam, infrared light beam and laser light beam, but the present disclosure is not limited thereto. In an embodiment, the light beam module 10 emits a light beam onto the edge of an object, such that the object generates a first reflecting light. The structural light projection module 11 is a laser diode (but the present disclosure is not limited thereto) for irradiating an optical pattern onto the object, such that the object generates a second reflecting light. The optical pattern consists of light spots or light stripes arranged in a specific pattern and presented in monochrome, grayscale, or colors, but the present disclosure is not limited thereto.

The image sensing module 12 comprises the image transducer S and the second computation processing module 121. The microlens 1 of the image transducer S receives the first reflecting light, the second reflecting light, and the third reflecting light resulting from the external light beam which falls on the object. In this embodiment, the external light beam is sunlight, ambient light or flashlight, but the present disclosure is not limited thereto.

This embodiment provides combinations described below.

Combination I: The waveband associated with the filtration carried out in the first function layer comprises visible light waveband and near-infrared waveband; and the visible light waveband comprises red waveband, blue waveband or green waveband. The waveband associated with the filtration carried out in the second function layer comprises near-infrared waveband. Combination II: The waveband associated with the filtration carried out in the first function layer comprises visible light waveband and ultraviolet waveband; and the waveband associated with the filtration carried out in the second function layer comprises visible light waveband. Combination III: The waveband associated with the filtration carried out in the first function layer comprises visible light waveband; and the waveband associated with the filtration carried out in the second function layer comprises near-infrared waveband. However, the present disclosure is not limited thereto.

Therefore, after being filtered by the first function layer 2, the third reflecting light is converted by the first photosensitive layer 3 into the first electrical signal, and then the first electrical signal is outputted to the first read circuit 6. The first reflecting light and second reflecting light are near-infrared. After being filtered by the second function layer 4, the first reflecting light and second reflecting light are converted by the second photosensitive layer 5 into the second electrical signal, and then the second electrical signal is outputted to the second read circuit 7. Like the preceding embodiment, this embodiment is characterized in that when the waveband of the third reflecting light filtered by the first function layer 2 is different from the waveband of the first and second reflecting lights filtered by the second function layer 4, the first read circuit 6 receives the first electrical signal and thus allows the first electrical signal to function as an output, whereas the second read circuit 7 receives the second electrical signal and thus allows the second electrical signal to function as an output. The second computation processing module 121 receives the first and second electrical signals and performs computation in accordance therewith to obtain pixel information and depth information of the object.

When the waveband of the third reflecting light filtered by the first function layer 2 is the same as the waveband of the first and second reflecting lights filtered by the second function layer 4, the first read circuit 6 receives the first electrical signal, whereas the second read circuit 7 receives the second electrical signal. When the first electrical signal is not greater than a predetermined saturation threshold, the first read circuit 6 transfers the first electrical signal and thus allows it to function as an output. Conversely, when the first electrical signal 6 is greater than a predetermined saturation threshold, the first read circuit 6 transfers the first electrical signal, whereas the second read circuit 7 transfers the second electrical signal, allowing the first and second electrical signals to function as outputs. The second computation processing module 121 receives and performs computation in accordance with the first electrical signal and/or second electrical signal to obtain pixel information and depth information of the object.

The image sensing module 12 obtains the depth information of the object with two different reflecting light beams. First, obtain the first reflecting light originating from the light beam which the light beam module 10 emits to the object. When the structural light projection module 11 emits an optical pattern onto the object, the edges of the object cannot be fully covered by the optical pattern. The light beam emitted from the light beam module 10 assists with capturing the images of the edges of the object. Second, obtain the second reflecting light originating from the optical pattern which the structural light projection module 11 emits onto the object. The second computation module 121 of the image sensing module 12 receives pattern codes of the first reflecting light and second reflecting light, compares the optical pattern with the light beam initially emitted for their difference, and calculates the three-dimensional coordinates of the object according to trigonometry principles, so as to obtain the depth information of the object.

When the second computation processing module 121 receives the first and second electrical signals and performs computation in accordance therewith, the second computation processing module 121 performs computation according to Beer-Lambert law with the first electrical signal, second electrical signal, first peak transmittance (i.e., peak transmittance of the first function layer 2 of the image transducer S), second peak transmittance (i.e., peak transmittance of the first photosensitive layer 3 of the image transducer S), third peak transmittance (i.e., peak transmittance of the second function layer 4 of the image transducer S), first light attenuation rate (i.e., light attenuation rate of light admitted into the first photosensitive layer 3 and absorbed), and second light attenuation rate (i.e., light attenuation rate of light admitted into the second photosensitive layer 5 and absorbed) to obtain a first light intensity, such that the second computation processing module 121 obtains the pixel information according to the first light intensity. Alternatively, when the second computation processing module 121 receives the first electrical signal and performs computation in accordance therewith, the second computation processing module 121 performs computation according to Beer-Lambert law with the first electrical signal, the first peak transmittance (i.e., peak transmittance of the first function layer 2 of the image transducer S), and the first light attenuation rate (i.e., light attenuation rate of light admitted into the first photosensitive layer 3 and absorbed) to obtain a second light intensity, such that the second computation processing module 121 obtains the pixel information according to the second light intensity. Finally, the first computation processing module 8 integrates the acquired depth information and pixel information and thereby generates a 3D image information.

Figure 5:
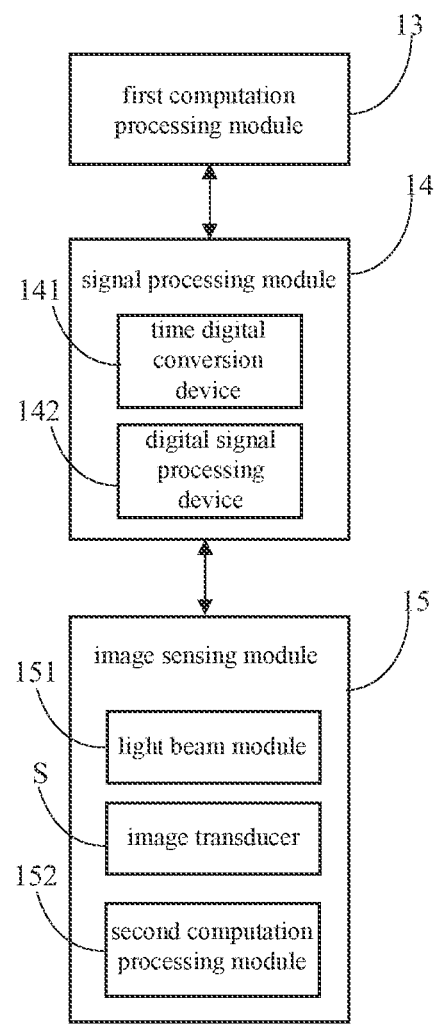
FIG. 5 is a schematic view of the system according to the fourth embodiment of the present disclosure.

Referring to FIG. 5, there is shown a schematic view of the system according to the fourth embodiment of the present disclosure. As shown in the diagram, the 3D image capturing system of the present disclosure comprises a first computation processing module 13, signal processing module 14 and image sensing module 15. The signal processing module 14 is in signal connection with the first computation processing module 13 and image sensing module 15, as described below.

The first computation processing module 13 outputs a processing command for driving the signal processing module 14 to capture 3D images and integrate the acquired depth information and pixel information and thereby generate a 3D image information. The signal processing module 14 comprises a time digital conversion device 141 and a digital signal processing device 142 which carry out signal processing according to the processing command to thereby generate a control command for controlling the operation of the image sensing module 15.

The image sensing module 15 comprises the image transducer S, light beam module 151 and second computation processing module 152. The light beam module 151 emits a light beam. The microlens 1 of the image transducer S receives the first reflecting light and the second reflecting light which reflects off the object as a result of the external light beam's falling on the object. After being filtered by the first function layer 2, the second reflecting light is converted by the first photosensitive layer 3 into the first electrical signal. Then, the first electrical signal is outputted to the first read circuit 6. After being filtered by the second function layer 4, the first reflecting light is converted by the second photosensitive layer 5 into the second electrical signal. Then, the second electrical signal is outputted to the second read circuit 7. The first read circuit 6 transfers the first electrical signal and thus allows it to function as an output. The second read circuit 7 transfers the second electrical signal and thus allows it to function as an output. The second computation processing module 152 receives the first and second electrical signals and performs computation in accordance therewith to obtain the pixel information and depth information of the object.

This embodiment is distinguished from the preceding embodiment by technical features described below. In this embodiment, the depth information of the object is calculated with the second computation processing module 152 and is equal to the product of the multiplication of light speed, i.e., $3.00 \times 10^8$ m/s, by the time taken by the microlens 1 of the image transducer S to receive the reflecting lights.

When the second computation processing module 121 receives the first electrical signal and second electrical signal and performs computation in accordance therewith, the second computation processing module 121 performs computation according to Beer-Lambert law with the first electrical signal, second electrical signal, first peak transmittance (i.e., peak transmittance of the first function layer 2 of the image transducer S), second peak transmittance (i.e., peak transmittance of the first photosensitive layer 3 of the image transducer S), third peak transmittance (i.e., peak transmittance of the second function layer 4 of the image transducer S), first light attenuation rate (i.e., light attenuation rate of light admitted into the first photosensitive layer 3 and absorbed), and second light attenuation rate (i.e., light attenuation rate of light admitted into the second photosensitive layer 5 and absorbed) to obtain a first light intensity, such that the second computation processing module 121 obtains the pixel information according to the first light intensity. Finally, the first computation processing module 13 integrates the acquired depth information and pixel information and thereby generates a 3D image information.

Therefore, the present disclosure provides an image transducer and a 3D image capturing system having the same. The image transducer comprises two photosensitive layers and is vertically structured. The two photosensitive layers greatly increase sensing waveband. The 3D image capturing system uses the image transducer to enhance the pixel screen fineness of the 3D screen. Therefore, the objectives of the present disclosure are achieved.

The present disclosure is disclosed above by preferred embodiments. However, persons skilled in the art should understand that the preferred embodiments are illustrative of the present disclosure only, but shall not be interpreted as restrictive of the scope of the present disclosure. Hence, all equivalent changes and modifications made to the aforesaid embodiments shall fall within the scope of the claims of the present disclosure.

What is claimed is:

1. A 3D image capturing system, comprising:
    a first computation processing module configured for outputting a processing command;
    a signal processing module configured in signal connection with the first computation processing module for carrying out signal processing according to the processing command and thereby generating a control command;
    a light beam module configured in signal connection with the signal processing module for receiving the control command and transferring a light beam to an object according to the control command, and thereby causing a first reflecting light reflecting off the object;
    a structural light projection module configured in signal connection with the signal processing module for receiving the control command and transferring an optical pattern to the object according to the control command, and thereby causing a second reflecting light reflecting off the object; and
    an image sensing module configured in signal connection with the signal processing module, the image sensing module comprising an image transducer and a second computation processing module;
    wherein the image transducer comprises:
        a microlens;
        a first function layer disposed below the microlens and having a first transmittance;
        a first photosensitive layer disposed below the first function layer and having a first electrode contact and a second electrode contact;
        a second function layer disposed below the first photosensitive layer and having a second transmittance;
        a second photosensitive layer disposed below the second function layer and having a third electrode contact and a fourth electrode contact;
        a first read circuit electrically connected to the first electrode contact and the second electrode contact of the first photosensitive layer; and
        a second read circuit electrically connected to the third electrode contact and the fourth electrode contact of the second photosensitive layer;
    wherein the first transmittance is greater than the second transmittance;
    wherein an external light beam falls on the object and thus causes a third reflecting light reflecting off the object;
    wherein the microlens of the image transducer receives the first reflecting light, the second reflecting light and the third reflecting light;
    wherein the third reflecting light is filtered by the first function layer and then converted by the first photosensitive layer into a first electrical signal to be outputted to the first read circuit through the first electrode contact and the second electrode contact;
    wherein the first reflecting light and the second reflecting light are filtered by the second function layer and then converted by the second photosensitive layer into a second electrical signal to be outputted to the second read circuit through the third electrode contact and the fourth electrode contact;
    wherein, when waveband of the third reflecting light filtered by the first function layer is different from waveband of the first reflecting light filtered by the second function layer and waveband of the second reflecting light filtered by the second function layer, the first electrical signal is received by the first read circuit to function as an output, the second electrical signal is received by the second read circuit to function as an output, and the second computation processing module receives the first electrical signal and the second electrical signal and performs computation in accordance therewith to obtain a pixel information and a depth information of the object; or
    wherein the first and second read circuits receive the first and second electrical signals, respectively, when waveband of the third reflecting light filtered by the first function layer is identical to waveband of the first reflecting light filtered by the second function layer and waveband of the second reflecting light filtered by the second function layer, wherein, when the first electrical signal is not greater than a predetermined saturation threshold, the first read circuit transfers the first electrical signal, allowing the first electrical signal to function as an output, and the second computation processing module receives the first electrical signal and performs computation in accordance therewith to obtain the pixel information and the depth information of the object; or, wherein, the first read circuit and the second read circuit receive the first signal and the second electrical signal, respectively, when waveband of the third reflecting light filtered by the first function layer is identical to waveband of the first reflecting light filtered by the second function layer and waveband of the second reflecting light filtered by the second function layer, wherein, when the first electrical signal is greater than the predetermined saturation threshold, the first read circuit and the second read circuit transfer the first electrical signal and the second electrical signal, respectively, allowing the first electrical signal and the second electrical signal to function as outputs and the second computation processing module receives the first electrical signal and the second electrical signal and performs computation in accordance therewith to obtain the pixel information and the depth information of the object;
    wherein the first computation processing module generates a 3D image information according to the depth information and the pixel information.

2. The 3D image capturing system of claim 1, wherein the light beam module further comprises a visible light beam, a near-infrared light beam and a laser light beam.

3. The 3D image capturing system of claim 1, wherein the signal processing module further comprises a digital signal processing device.

4. The 3D image capturing system of claim 1, wherein when the second computation processing module receives the first electrical signal and the second electrical signal, the second computation processing module performs computation in accordance with the first electrical signal, the second electrical signal, a first peak transmittance, a second peak transmittance, a third peak transmittance, a first light attenuation rate and a second light attenuation rate according to Beer-Lambert law to obtain a first light intensity and obtain the pixel information according to the first light intensity, or when the second computation processing module receives the first electrical signal, the second computation processing module performs computation in accordance with the first electrical signal, the first peak transmittance and the first light attenuation rate according to Beer-Lambert law to obtain a second light intensity and obtain the pixel information according to the second light intensity.

5. The 3D image capturing system of claim 1, wherein the first photosensitive layer and the second photosensitive layer are made of amorphous silicon, polycrystalline silicon, copper gallium diselenide (CGS), copper indium gallium diselenide (CIGS), or organic semiconductor.

6. The 3D image capturing system of claim 1, wherein the image transducer further comprises: a first shield layer and a second shield layer, the first shield layer is disposed between the first photosensitive layer and the second function layer to shield the first photosensitive layer and the second function layer against electrical signal interference from each other, and the second shield layer is disposed between the second function layer and the second photosensitive layer to shield the second function layer and the second photosensitive layer against electrical signal interference from each other.

7. The 3D image capturing system of claim 1, wherein the first photosensitive layer is a photodiode, and the second photosensitive layer is a photodiode, an avalanche photodiode (APD) or a single photon avalanche diode (SPAD).

8. A 3D image capturing system, comprising:
a first computation processing module configured for outputting a processing command;
a signal processing module configured in signal connection with the first computation processing module for carrying out signal processing according to the processing command and thereby generating a control command; and
an image sensing module configured in signal connection with the signal processing module, the image sensing module comprising an image transducer, a light beam module and a second computation processing module, the light beam module irradiating a light beam onto an object for a first reflecting light reflecting off the object;
wherein the image transducer comprises:
  a microlens;
  a first function layer disposed below the microlens and having a first transmittance;
  a first photosensitive layer disposed below the first function layer and having a first electrode contact and a second electrode contact;
  a second function layer disposed below the first photosensitive layer and having a second transmittance;
  a second photosensitive layer disposed below the second function layer and having a third electrode contact and a fourth electrode contact;
  a first read circuit electrically connected to the first electrode contact and the second electrode contact of the first photosensitive layer; and
  a second read circuit electrically connected to the third electrode contact and the fourth electrode contact of the second photosensitive layer;
wherein an external light beam falls on the object and thus causes a second reflecting light reflecting off the object;
wherein the microlens of the image transducer receives the first reflecting light and the second reflecting light;
wherein the second reflecting light is filtered by the first function layer and then converted by the first photosensitive layer into a first electrical signal, allowing the first electrical signal to be outputted to the first read circuit through the first electrode contact and the second electrode contact;
wherein the first reflecting light is filtered by the second function layer and then converted by the second photosensitive layer into a second electrical signal, allowing the second electrical signal to be outputted to the second read circuit through the third electrode contact and the fourth electrode contact;
wherein the second computation processing module receives the first electrical signal and the second electrical signal and performs computation in accordance with the first electrical signal and the second electrical signal to obtain a pixel information and a depth information of the object;
wherein when the second computation processing module receives the first electrical signal and the second electrical signal and performs computation in accordance therewith, the second computation processing module performs computation according to Beer-Lambert law with the first electrical signal, the second electrical signal, a first peak transmittance, a second peak transmittance, a first light attenuation rate and a second light attenuation rate to obtain a light intensity, such that the second computation processing module obtains the pixel information according to the light intensity.

9. The 3D image capturing system of claim 8, wherein the light beam module further comprises a visible light beam, a near-infrared light beam and a laser light beam.

10. The 3D image capturing system of claim 8, wherein the signal processing module further comprises a time digital conversion device and a digital signal processing device.

11. The 3D image capturing system of claim 8, wherein the first photosensitive layer and the second photosensitive layer are made of amorphous silicon, polycrystalline silicon, copper gallium diselenide (CGS), copper indium gallium diselenide (CIGS), or organic semiconductor.

12. The 3D image capturing system of claim 8, wherein the image transducer further comprises: a first shield layer and a second shield layer, the first shield layer is disposed between the first photosensitive layer and the second function layer to shield the first photosensitive layer and the second function layer against electrical signal interference from each other, and the second shield layer is disposed between the second function layer and the second photosensitive layer to shield the second function layer and the second photosensitive layer against electrical signal interference from each other.

13. The 3D image capturing system of claim 8, wherein the first photosensitive layer is a photodiode, and the second photosensitive layer is a photodiode, an avalanche photodiode (APD) or a single photon avalanche diode (SPAD).

* * * * *